US012615941B2

(12) United States Patent
Xin et al.

(10) Patent No.: US 12,615,941 B2
(45) Date of Patent: Apr. 28, 2026

(54) TRANSPARENT DISPLAY PANEL AND DISPLAY DEVICE WITH ADJACENT SUBPIXELS OF SAME COLOR ARRANGEMENT

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventors: Yu Xin, Shanghai (CN); Huiping Chai, Shanghai (CN); Bing Han, Shanghai (CN)

(73) Assignees: Wuhan Tianma Micro-Electronics Co., Ltd., Wuhan (CN); Wuhan Tianma MicroElectronics Co., Ltd. Shanghai Branch, Shanghai (CN)

( * ) Notice: Subject to any disclaimer, the term of this patent is extended or adjusted under 35 U.S.C. 154(b) by 715 days.

(21) Appl. No.: 17/962,981

(22) Filed: Oct. 10, 2022

(65) Prior Publication Data

US 2023/0422570 A1     Dec. 28, 2023

(30) Foreign Application Priority Data

Jun. 27, 2022    (CN) .......................... 202210742841.4

(51) Int. Cl.
*H10K 59/35*          (2023.01)
*H10K 50/813*         (2023.01)
(Continued)

(52) U.S. Cl.
CPC ......... *H10K 59/353* (2023.02); *H10K 50/813* (2023.02); *H10K 50/822* (2023.02); *H10K 59/12* (2023.02)

(58) Field of Classification Search
CPC .. H10K 59/353; H10K 50/813; H10K 50/822; H10K 59/352; H10K 59/80521; H10K 50/828

See application file for complete search history.

(56) References Cited

U.S. PATENT DOCUMENTS

| | | | | |
|---|---|---|---|---|
| 8,330,352 B2 * | 12/2012 | Sung | ................... | G09G 3/3208 313/506 |
| 2014/0246654 A1 * | 9/2014 | Huang | ................. | H10K 59/353 257/40 |

(Continued)

FOREIGN PATENT DOCUMENTS

| | | |
|---|---|---|
| CN | 103440822 A | 12/2013 |
| CN | 106653799 A | 5/2017 |

(Continued)

*Primary Examiner* — Chad M Dicke
*Assistant Examiner* — Jeremy Daniel Watts
(74) *Attorney, Agent, or Firm* — Anova Law Group, PLLC

(57)                    ABSTRACT

Display panel and display device are provided. The display panel includes a plurality of pixel units disposed along a first direction and a second direction. A pixel unit of the plurality of pixel units includes at least three subpixels with different colors. In a same pixel unit, at least two of the subpixels are disposed along a first direction. Along a second direction, at least one of the subpixels is on a side of the two subpixels disposed along the first direction. The first direction intersects the second direction. In two pixel units that are at least partially adjacent, a subpixel in one of the two pixel units is adjacent to a subpixel in the other one of the two pixel units. Colors of the two adjacent subpixels are same.

21 Claims, 10 Drawing Sheets

(51) Int. Cl.
     *H10K 50/822*     (2023.01)
     *H10K 59/12*     (2023.01)

(56)          References Cited

U.S. PATENT DOCUMENTS

| | | | | |
|---|---|---|---|---|
| 2016/0133675 A1* | 5/2016 | Yata | .................... | H10K 59/351 |
| | | | | 257/89 |
| 2016/0254326 A1* | 9/2016 | Ji | ......................... | H10K 59/35 |
| | | | | 257/40 |
| 2019/0386242 A1* | 12/2019 | Choi | ................... | H10K 59/353 |
| 2020/0058245 A1* | 2/2020 | Cui | ....................... | H10K 71/00 |
| 2022/0028950 A1* | 1/2022 | Ma | ........................ | H04N 5/265 |
| 2024/0298502 A1* | 9/2024 | Bi | ........................ | C23C 14/042 |

FOREIGN PATENT DOCUMENTS

| | | | |
|---|---|---|---|
| CN | 107146804 A | 9/2017 |
| CN | 206564254 U | 10/2017 |
| CN | 107342039 A | 11/2017 |
| CN | 112103321 A | 12/2020 |
| CN | 112909045 A | 6/2021 |

* cited by examiner

L0 A00

100

P

200

TRANSPARENT DISPLAY PANEL AND DISPLAY DEVICE WITH ADJACENT SUBPIXELS OF SAME COLOR ARRANGEMENT

CROSS-REFERENCE TO RELATED APPLICATION

This application claims priority of Chinese Patent Application No. 202210742841.4, filed on Jun. 27, 2022, the entire contents of which are hereby incorporated by reference.

FIELD OF THE DISCLOSURE

The present disclosure generally relates to the field of display technology and, more particularly, relates to a display panel and a display device.

BACKGROUND

With a development of display technology, a transparent display has attracted much attention as a new application in recent years. The transparent display technology greatly expands scenarios and scope of display applications. The transparent display means that a display has a certain degree of penetration and can clearly show a background behind a panel. Transparent displays are suitable for various applications such as a building window, a car window, and a shop window. In addition to an original transparent display function, a transparent display also has a potential to be used as an information display in the future, thereby attracting much attention from the market.

However, an existing transparent display product is prone to a bright visual effect every other row or every other column in a display process, thereby forming visual bright lines and affecting an overall display quality.

BRIEF SUMMARY OF THE DISCLOSURE

One aspect of the present disclosure provides a display panel. The display panel includes a plurality of pixel units disposed along a first direction and a second direction. A pixel unit of the plurality of pixel units includes at least three subpixels with different colors. In a same pixel unit, at least two of the subpixels are disposed along a first direction. Along a second direction, at least one of the subpixels is on a side of the two subpixels disposed along the first direction. The first direction intersects the second direction. In two pixel units that are at least partially adjacent, a subpixel in one of the two pixel units is adjacent to a subpixel in the other one of the two pixel units. Colors of the two adjacent subpixels are same.

Another aspect of the present disclosure provides a display device. The display device includes a display panel. The display panel includes a plurality of pixel units disposed along a first direction and a second direction. A pixel unit of the plurality of pixel units includes at least three subpixels with different colors. In a same pixel unit, at least two of the subpixels are disposed along a first direction. Along a second direction, at least one of the subpixels is on a side of the two subpixels disposed along the first direction. The first direction intersects the second direction. In two pixel units that are at least partially adjacent, a subpixel in one of the two pixel units is adjacent to a subpixel in the other one of the two pixel units, and colors of the two adjacent subpixels are same.

Other aspects of the present disclosure can be understood by a person skilled in the art in light of the description, the claims, and the drawings of the present disclosure.

BRIEF DESCRIPTION OF THE DRAWINGS

Accompanying drawings, which are incorporated in and constitute part of the present specification, illustrate embodiments of the present disclosure and together with a description, serve to explain principles of the present disclosure.

DETAILED DESCRIPTION

Various exemplary embodiments of the present disclosure will be described in detail with reference to the accompanying drawings. It should be noted that, unless specifically stated otherwise, a relative arrangement of components and steps, numerical expressions and numerical values set forth in the embodiments do not limit the scope of the present disclosure.

The following description of at least one exemplary embodiment is merely illustrative and is not intended to limit the present disclosure and application or use thereof.

Techniques, methods, and apparatus known to a person skilled in the art may not be discussed in detail, but where appropriate, such techniques, methods, and apparatus should be considered as part of the present specification.

In all examples shown and discussed herein, any specific value should be construed as illustrative only and not as a limitation. Accordingly, other examples of exemplary embodiments may have different values.

It will be apparent to a person skilled in the art that various modifications and variations can be made in the present disclosure without departing from the spirit or scope of the present disclosure. Accordingly, the present disclosure is intended to cover the modifications and variations of the present disclosure that fall within the scope of corresponding claims (claimed technical solutions) and equivalents thereof. It should be noted that, implementations provided in the embodiments of the present disclosure may be combined with each other if there is no contradiction.

It should be noted that similar numerals and letters refer to similar items in the following accompanying drawings. Once an item is defined in one accompanying drawing, it does not require further discussion in subsequent accompanying drawings.

Figure 1:
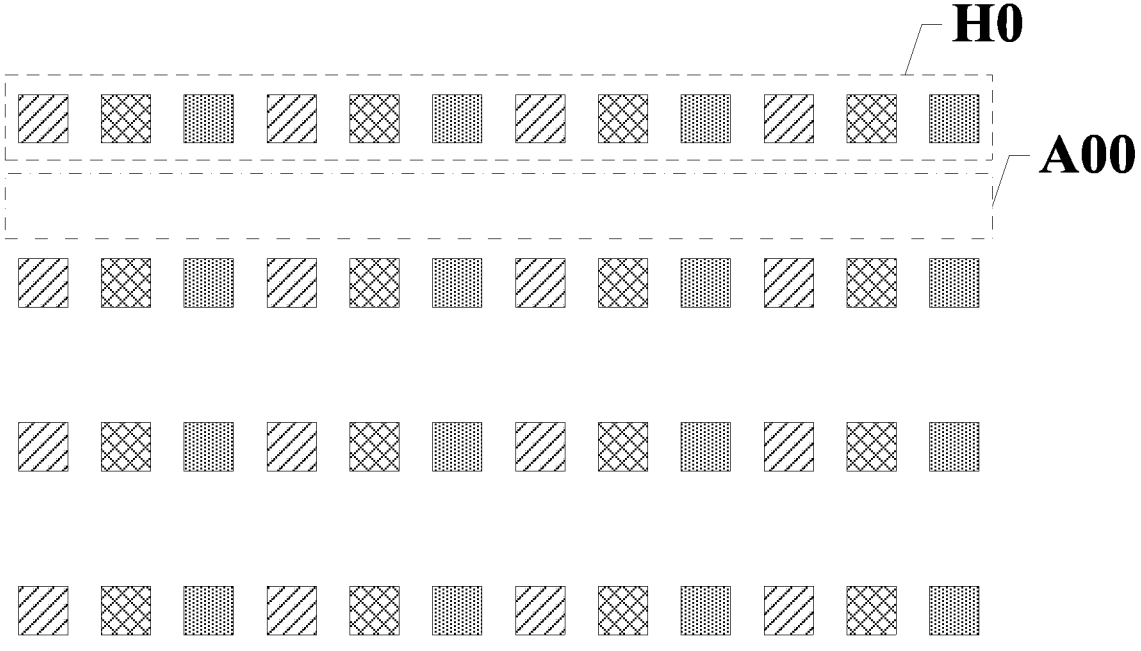
FIG. 1 illustrates a pixel arrangement diagram of a transparent display panel.

FIG. 1 illustrates a pixel arrangement diagram of a transparent display panel. A plurality of pixel rows H0 are formed in the transparent display panel, and different pixel rows H0 are disposed along a column direction. Since the subpixels are centrally disposed in different pixel rows H0, an area between two adjacent pixel rows H0 forms a light-transmitting area A00 of the transparent display panel. The light-transmitting area A00 is embodied as an elongated structure extending along a row direction. In a display process, a difference in brightness between the plurality of pixel rows H0 and the light-transmitting area A00 exists, which leads to a bright visual effect every other row on the transparent display panel, thereby forming visual bright lines extending along the row direction and affecting an overall display quality.

Figure 2:
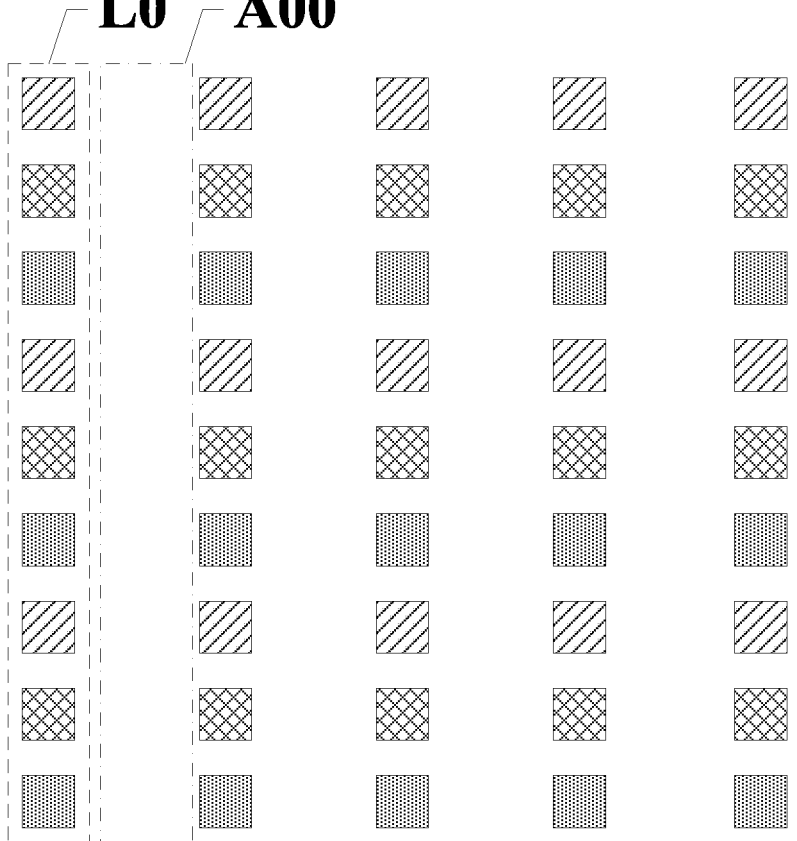
FIG. 2 illustrates another pixel arrangement diagram of a transparent display panel.

Similarly, FIG. 2 illustrates another pixel arrangement diagram of a transparent display panel. A plurality of pixel columns L0 is formed in the transparent display panel, and different pixel columns L0 are disposed along the row direction. Since subpixels are centrally disposed in different pixel rows L0, an area between two adjacent pixel rows L0 forms the light-transmitting area A00 of the transparent display panel, and the light-transmitting area A00 is embodied as an elongated structure extending along the column direction. In a display process, a difference in brightness between the plurality of pixel columns L0 and the light-transmitting area A00 exists, which leads to a bright visual effect every other column on the transparent display panel, thereby forming a visual bright line extending along the column direction and affecting an overall display quality.

The present disclosure provides a display panel including a plurality of pixel units disposed along a first direction and a second direction. A pixel unit of the plurality of pixel units includes at least three subpixels with different colors. In a same pixel unit, at least two subpixels are disposed along the first direction. Along the second direction, at least one subpixel is on a side of two subpixels disposed along the first direction, The first direction intersects the second direction. In two pixel units that are at least partially adjacent, a subpixel in one of the two pixel units is adjacent to a subpixel in the other one of the two pixel units, and colors of the two adjacent subpixels are same. By improving an arrangement of subpixels in a pixel unit, a difference between brightness of light emitted by two adjacent pixel rows and brightness of an area between the two adjacent pixel rows is effectively avoided or weakened, and a phenomenon of visual bright lines appearing in a display process is avoided or weakened. When applied to a transparent display product, the present disclosure is beneficial to improve display quality of the transparent display product.

The above is a core idea of the present disclosure, and technical solutions in the embodiments of the present disclosure will be clearly and completely described below with reference to the accompanying drawings in the embodiments of the present disclosure. Based on the embodiments of the present disclosure, all other embodiments obtained by a person skilled in the art without creative efforts fall within the protection scope of the embodiments of the present disclosure.

Figure 3:
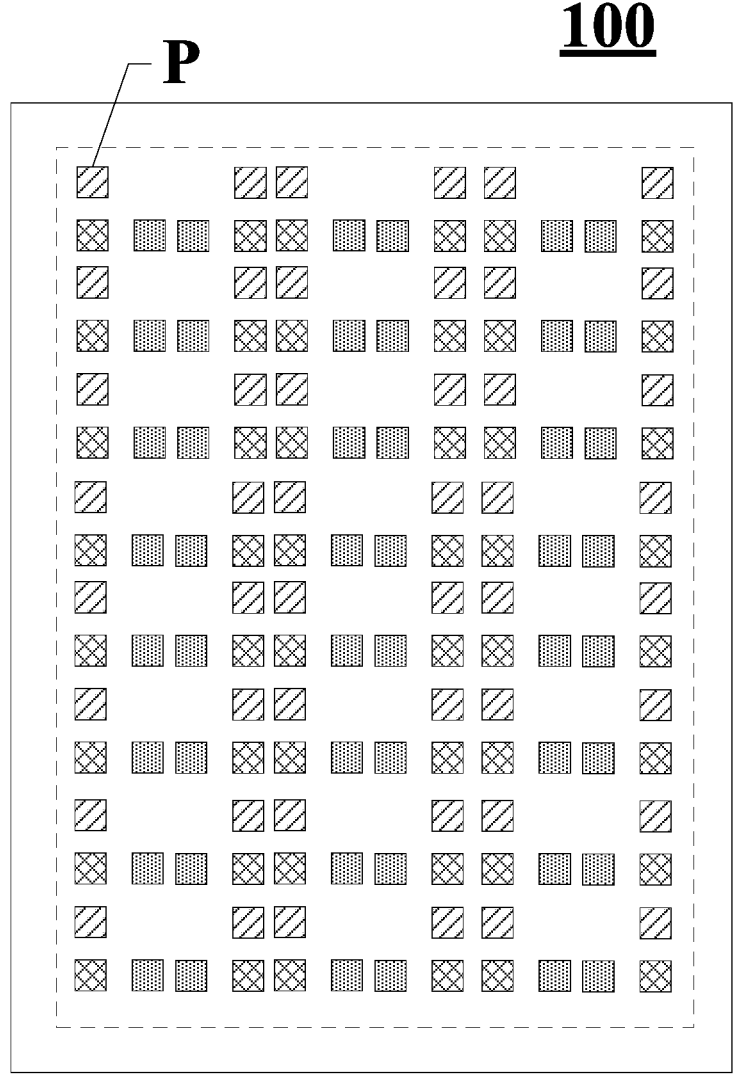
FIG. 3 illustrates a structural view of a display panel according to one embodiment of the present disclosure.
Figures 4, 5:
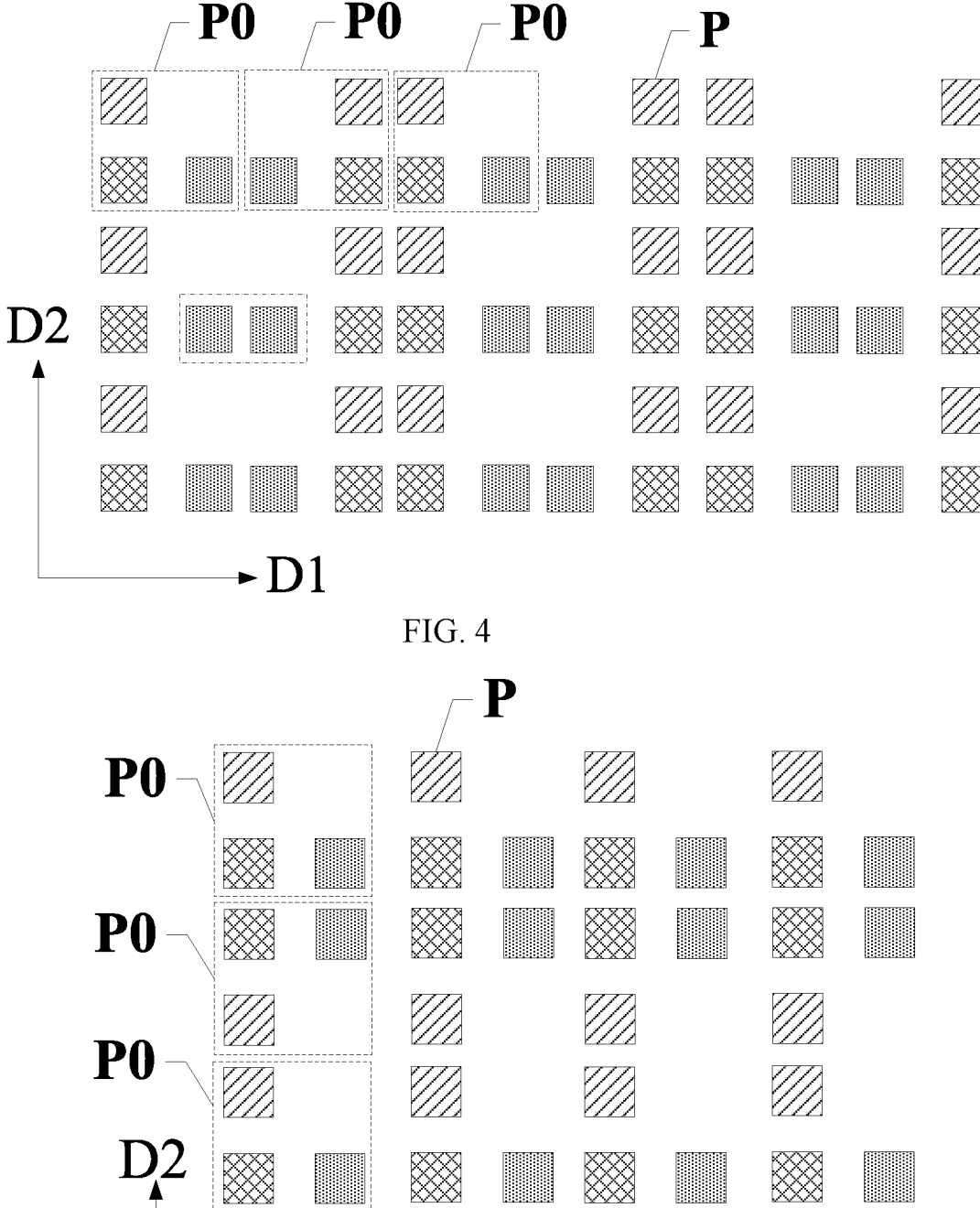
FIG. 4 illustrates a pixel arrangement diagram of a display panel according to one embodiment of the present disclosure.
FIG. 5 illustrates another pixel arrangement diagram of a display panel according to one embodiment of the present disclosure.

FIG. 3 illustrates a structural view of a display panel according to one embodiment of the present disclosure. FIG. 4 illustrates a pixel arrangement diagram of a display panel according to one embodiment of the present disclosure. Referring to FIG. 3 and FIG. 4, one embodiment of the present disclosure provides a display panel 100, including a plurality of pixel units P0 disposed along a first direction D1 and a second direction D2. A pixel unit P0 of the plurality of pixel units includes at least three subpixels P with different colors. In a same pixel unit P0, at least two subpixels P are disposed along the first direction D1, and along the second direction D2, at least one subpixel P is located on one side of the two subpixels P disposed along the first direction D1, and the first direction D1 intersects the second direction D2. In two pixel units P0 that are at least partially adjacent, a subpixel P in one of the two pixel unit P0 is adjacent to a subpixel P in the other pixel unit P0, and colors of the two adjacent subpixels P are same. Optionally, the first direction D1 is perpendicular to the second direction D2.

Specifically, in the embodiment, the display panel may be a transparent display panel using an organic light-emitting diode display technology. In the display panel, an arrangement of subpixels P included in the pixel unit P0 is improved. Referring to FIG. 4, a same pixel unit P0 includes at least three subpixels P with different colors. At least two subpixels P in the same pixel unit P0 are disposed along the first direction D1, and another subpixel P is on a side of two subpixels P disposed along the first direction D1 along the second direction D2. Therefore, each pixel unit P0 has both subpixels P disposed along the first direction D1 and subpixels P disposed along the second direction D2. Compared with a related art in which a plurality of subpixels P in a same pixel unit P0 are disposed in a row direction or in a column direction, in the present disclosure, when a plurality of pixel units P0 emit light, there are both light emitted by the subpixels P disposed in the first direction D1 and light emitted by the subpixels P disposed in the second direction D2. Therefore, a difference between brightness of light emitted by two adjacent pixel rows in a related art and brightness of an area between the two adjacent pixel rows is effectively avoided or weakened, which is conducive to avoiding or weakening a phenomenon of visual bright lines appearing in a display process. When applied to a transparent display product, the present disclosure is conducive to improving display quality of the transparent display product.

In addition, due to an arrangement of the subpixels P in the pixel units P0 of the present disclosure, in at least part of two adjacent pixel units P0, one subpixel P in one pixel unit P0 is adjacent to one subpixel P in the other pixel unit P0. Colors of the adjacent two subpixels P are same, and cathode electrode blocks of a same color and the adjacent two subpixels P can share openings of a metal mask formed by evaporation, thereby helping reduce number of the openings of the metal mask used in a forming process, preventing the metal mask from reducing strength thereof due to too many openings and too small size of the metal mask, and improving strength of the metal mask. At a same time, the cathode electrode blocks of the two adjacent subpixels P with a same color be shared and co-evaporated, thereby increasing a size of the same cathode electrode block. Compared with an evaporation method of small-sized cathode electrode blocks, the present embodiment also helps reduce a complexity of a forming process.

It should be noted that, in the embodiment, FIG. 3 only illustrates a structure of the display panel. During specific implementation, a structure of the display panel includes but is not limited to the structure of the display panel in FIG. 3, and may also include other structures, such as a film layer structure, a pixel circuit, a driving circuit, a packaging structure, and the like of the display panel, which are not repeated herein. Details of the other structures can be understood with reference to a structure of an organic light-emitting diode display panel in a related art. In addition, FIG. 3 only takes a rectangular structure as an example to illustrate one shape of the display panel. In some other embodiments, the display panel may also be embodied as a rounded rectangle, circle, oval, or any other feasible shape.

It should be further noted that the drawings in the embodiment only illustrate sizes and shapes of a pixel unit P0 and three subpixels P in the pixel unit P0. During specific implementation, the sizes and shapes of the pixel unit P0 and the three subpixels P in the pixel unit P0 include but are not limited to the sizes and shapes of the pixel unit P0 and the three subpixels P in the pixel unit P0 shown in FIG. 4, and may also be other sizes and shapes, which are not limited herein.

Figure 6:
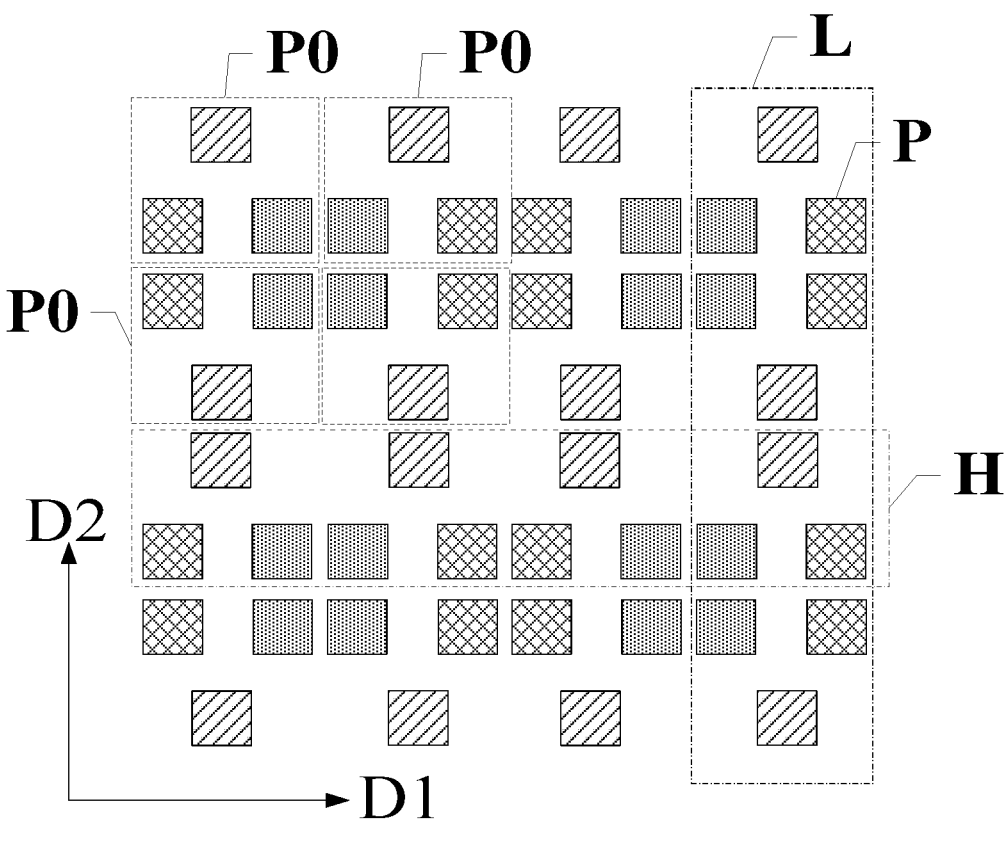
FIG. 6 illustrates another pixel arrangement diagram of a display panel according to one embodiment of the present disclosure.
Figure 7:
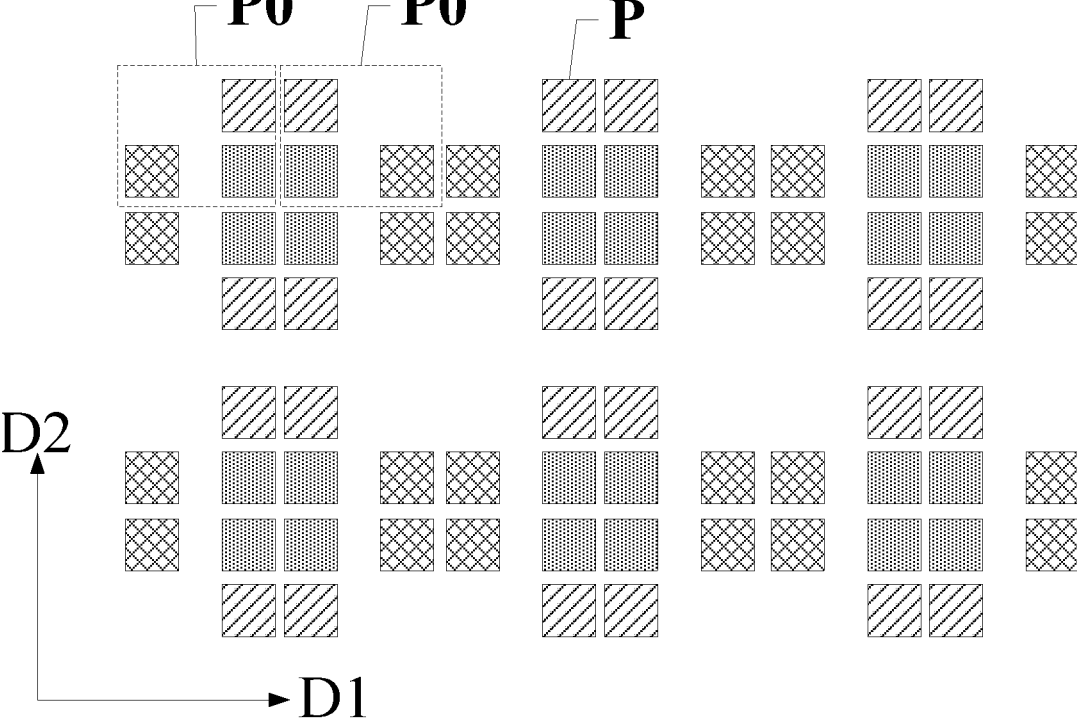
FIG. 7 illustrates another pixel arrangement diagram of a display panel according to one embodiment of the present disclosure.

FIG. 5 to FIG. 7 respectively illustrate pixel arrangement diagrams of s display panel provided by embodiments of the present disclosure. One embodiment of FIG. 5 illustrates a scheme in which subpixels P in adjacent pixel units P0 along the second direction D2 are disposed in a mirror image arrangement. Embodiments of FIGS. 6 and 7 illustrate that the subpixels P in adjacent pixel units P0 along the first direction D1 are disposed in a mirror image arrangement, and subpixels P in adjacent pixel units P0 along the second direction D2 are mirror image arrangements.

Referring to FIGS. 4-7, in one optional embodiment, subpixels P in two adjacent pixel units P0 along the first direction D1 are disposed in a mirror image arrangement, and/or subpixels P in two adjacent pixel units P0 along the second direction D2 are disposed in a mirror image arrangement.

Specifically, in a pixel structure shown in FIG. 4, subpixels P in two adjacent pixel units P0 along the first direction D1 are disposed in a mirror image arrangement. Taking three pixel units P0 shown in a dotted box in FIG. 4 as an example, subpixels P in a pixel unit P0 in a middle of the three pixel units are disposed in a mirror image arrangement with the subpixel P in a pixel unit P0 on a left side of the pixel unit P0 in the middle of the three pixel units and are also disposed in a mirror image arrangement with subpixels P in a pixel unit P0 on a right side of the pixel unit P0 in the middle of the three pixel units. Center connection lines of three subpixels P in a same pixel unit P0 are in a triangle shape, and are disposed in a mirror image arrangement, thereby effectively avoiding that in pixel units P0 in a same row, a light-transmitting area with a larger area appears exists between two adjacent pixel units P0. When the light-transmitting area is embodied as a strip-like arrangement in a related art, a diffraction phenomenon may occur, which affects a display effect. Therefore, in the present disclosure, when subpixels P in two adjacent pixel units P0 along the first direction D1 are disposed in a mirror image arrangement, a phenomenon of long-stripe arrangement in the light-transmitting areas in a related art is broken, thereby avoiding or reducing an occurrence probability of a diffraction phenomenon of the display panel, avoiding or weakening a phenomenon of visual bright lines in the display process, and improving display effect of the display panel.

In a pixel structure shown in FIG. 5, subpixels P in two adjacent pixel units P0 along the second direction D2 are disposed in a mirror image arrangement. Taking three pixel units P0 shown in a dotted box in FIG. 4 as an example, subpixels P in a pixel unit P0 in a middle of the three pixel units are not only disposed in a mirror image arrangement with subpixel P in a pixel unit P0 above the pixel unit P0 in the middle of the three pixel units P0, but also disposed in a mirror image arrangement with the subpixel P in the pixel unit P0 below the pixel unit P0 in the middle of the three pixel units. Center connection lines of three subpixels P in a same pixel unit P0 are in a triangle shape and are disposed in a mirror-image manner along the second direction D2, which can also break a phenomenon of long-stripe arrangement in a light-transmitting area in a related art, thereby helping avoid or reduce an occurrence probability of a diffraction phenomenon of the display panel, helping avoid or weaken a phenomenon of visual bright lines in the display process, and helping improve display effect of the display panel.

In two pixel arrangement structures shown in embodiments shown in FIG. 6 and FIG. 7, subpixels P in any two adjacent pixel units P0 along the first direction D1 or along the second direction D2 are disposed in a mirror image arrangement. Moreover, center connection lines of three subpixels P in each pixel unit P0 are all triangles, which can also break a phenomenon of a long-stripe arrangement in a light-transmitting area in a related art, thereby helping avoid or reduce an occurrence probability of a diffraction phenomenon of the display panel, helping avoid or weaken a phenomenon of visual bright lines in the display process, and helping improve display effect of the display panel.

Figures 8, 9, 10:
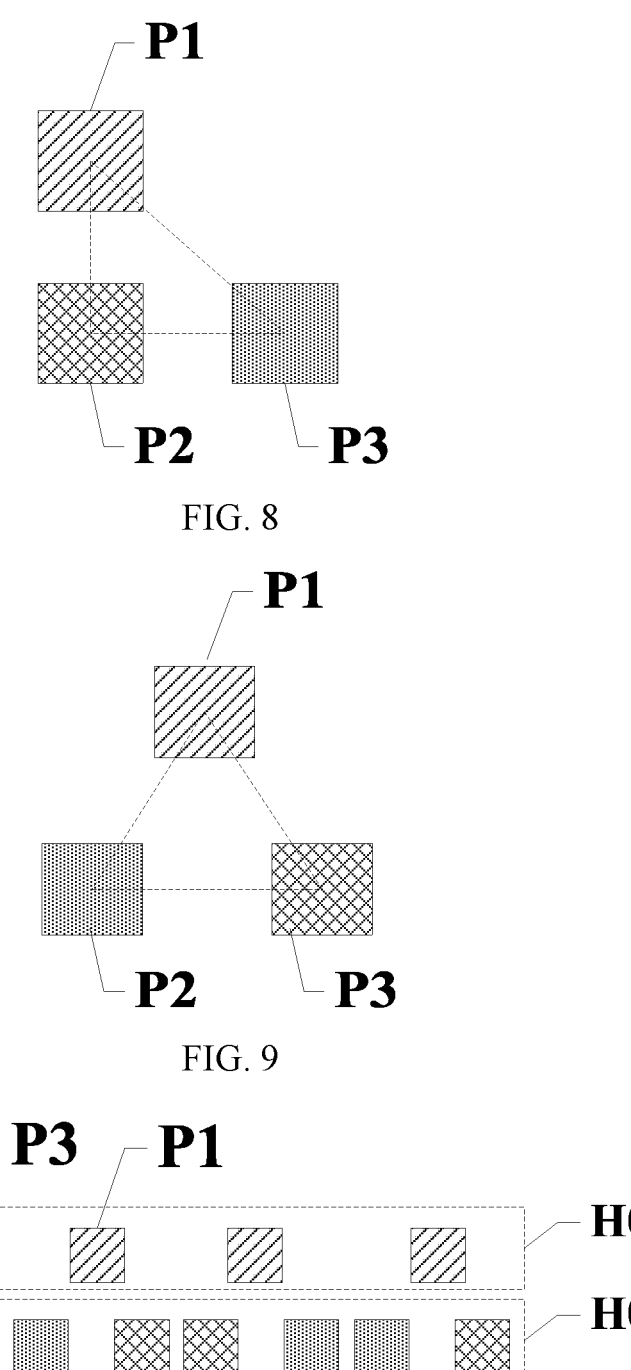
FIG. 8 illustrates an arrangement diagram of three subpixels in a same pixel unit in a display panel according to one embodiment of the present disclosure.
FIG. 9 illustrates another arrangement diagram of three subpixels in a same pixel unit in a display panel according to one embodiment of the present disclosure.
FIG. 10 illustrates an arrangement diagram of two pixel unit rows in a display panel according to one embodiment of the present disclosure.

FIGS. 8 and 9 respectively illustrate arrangement diagrams of three subpixels P in a same pixel unit P0. Referring to FIGS. 8 and 9, in one optional embodiment, a pixel unit P0 includes three subpixels P with different colors, and lines connecting geometric centers of the three subpixels P in a same pixel unit P0 are a right-angled triangle or an isosceles triangle.

Specifically, one embodiment of FIG. 8 illustrates a solution in which connection lines between geometric centers of three subpixels P in a same pixel unit P0 is a right triangle. An overall arrangement structure of a type of the above pixel unit P0 can be referred to FIG. 4, FIG. 5 and FIG. 7. One embodiment of FIG. 9 illustrates a solution in which connection lines between geometric centers of three subpixels P in a same pixel unit P0 is an isosceles triangle. An overall arrangement structure of a type of the above pixel unit P0 can be referred to FIG. 6. An arrangement of a right-angled triangle or isosceles triangle can break a phenomenon of a long-stripe arrangement in a light-transmitting area in a related art, avoid an appearance of bright visual lines, and weaken or avoid an occurrence of diffraction. When a isosceles triangle structure is adopted, a phenomenon in which many subpixels P are disposed in separate columns can also be avoided, which is more conductive to avoiding an occurrence of a diffraction phenomenon.

Referring to FIG. 6, in one optional embodiment, pixel units P0 form a plurality of pixel unit rows H disposed along the second direction D2 and a plurality of pixel unit columns L disposed along the first direction D1. Subpixels P in adjacent two pixel unit rows H are disposed in a mirror image arrangement. Subpixels P in adjacent two pixel unit columns L are disposed in a mirror image arrangement.

Specifically, when a pixel arrangement in the display panel is observed in units of pixel unit rows H, subpixels P in two adjacent pixel unit rows H along the second direction D2 are disposed in a mirror image arrangement as a whole. Colors of adjacent subpixels P along the second direction D2 in adjacent pixel unit row H are same, and cathode electrode blocks 20 of adjacent subpixels P with a same color can be shared and co-evaporated, thereby helping reduce a complexity of a forming process. Since connection lines between geometric centers of three subpixels P in each pixel unit P0 are in a triangle shape, and part of subpixels P in adjacent pixel unit rows H are adjacent along the second direction D2, thereby effectively reducing a spacing between adjacent pixel unit rows H, and also avoiding forming a long strip-shaped light-transmitting area with a large area between adjacent pixel unit rows H, avoiding visual bright lines or a diffraction phenomenon caused by a regular arrangement of the long strip-shaped light-transmitting area, and helping improve overall display quality of the display panel.

Similarly, since two adjacent pixel unit columns L along the first direction D1 are disposed in a mirror image arrangement, adjacent subpixels P in adjacent two pixel unit columns L along the first direction D1 have a same color, cathode electrode blocks 20 of adjacent subpixels P in adjacent two pixel unit columns L along the first direction D1 with a same color can be shared and co-evaporated, thereby simplifying a forming process of the display panel. Since connection lines between geometric centers of three subpixels P in each pixel unit P0 are in a triangle shape, and part of subpixels P in adjacent pixel unit columns L along the first direction D1 are adjacent along the first direction D1, thereby effectively reducing a spacing between adjacent pixel unit columns L, avoiding forming a long strip-shaped light-transmitting area with a large area between adjacent pixel unit columns L, avoiding visual bright lines or a diffraction phenomenon caused by a regular arrangement of the long strip-shaped light-transmitting area, and helping improve overall display quality of the display panel.

FIG. 10 illustrates an arrangement diagram of two pixel unit rows in a display panel according to one embodiment of the present disclosure. Referring to FIG. 10, in one optional embodiment, a same pixel unit row H includes a first subpixel row H01 and a second subpixel row H02, the first subpixel row H01 includes first color subpixels P1, and the second subpixel row H02 includes second-color subpixels P2 and third-color subpixels P3.

Specifically, a single pixel unit row H includes two subpixel rows, which are a first subpixel row H01 and a second subpixel row H02 respectively disposed along the second direction D2. When a same pixel unit P0 includes three subpixels P of different colors, subpixels P included in the first subpixel row H01 have a same color, that is, the subpixels P included in the first subpixel row H01 are all first color subpixels P1. Subpixels P included in the second subpixel row H02 are subpixels with two colors, which are the second-color subpixels P2 and the third-color subpixels P3 respectively. Optionally, the first color subpixel P1 in the first subpixel row H01 may be embodied as any one of red, green, and blue subpixels P. The second color subpixels P2 in the second subpixel row H02 can be embodied as other two colors different from a color of the first color subpixels P1. For example, if the first color subpixel P1 is green, the second color subpixel P2 and the third color subpixel P3 are red and blue respectively; or if the first color subpixel P1 is blue, the second color subpixel P2 and the third color subpixel P3 are green and red; or if the first sub-color pixel P1 is red, and the second color subpixel P2 and the third color subpixel P3 are green and blue respectively. A pixel arrangement adopting any color can effectively improve visual bright lines and a diffraction problems, thereby improving display quality.

Figure 11:
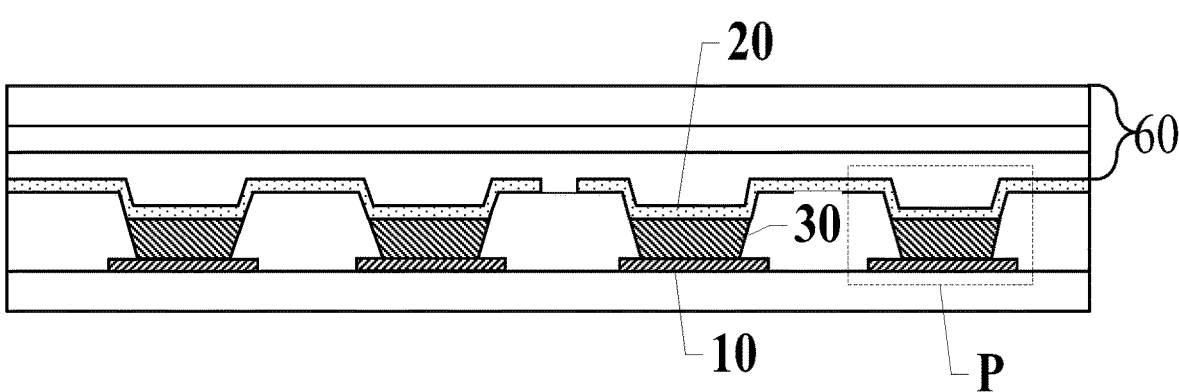
FIG. 11 illustrates a film layer diagram of a display panel according to one embodiment of the present disclosure.
Figure 12:
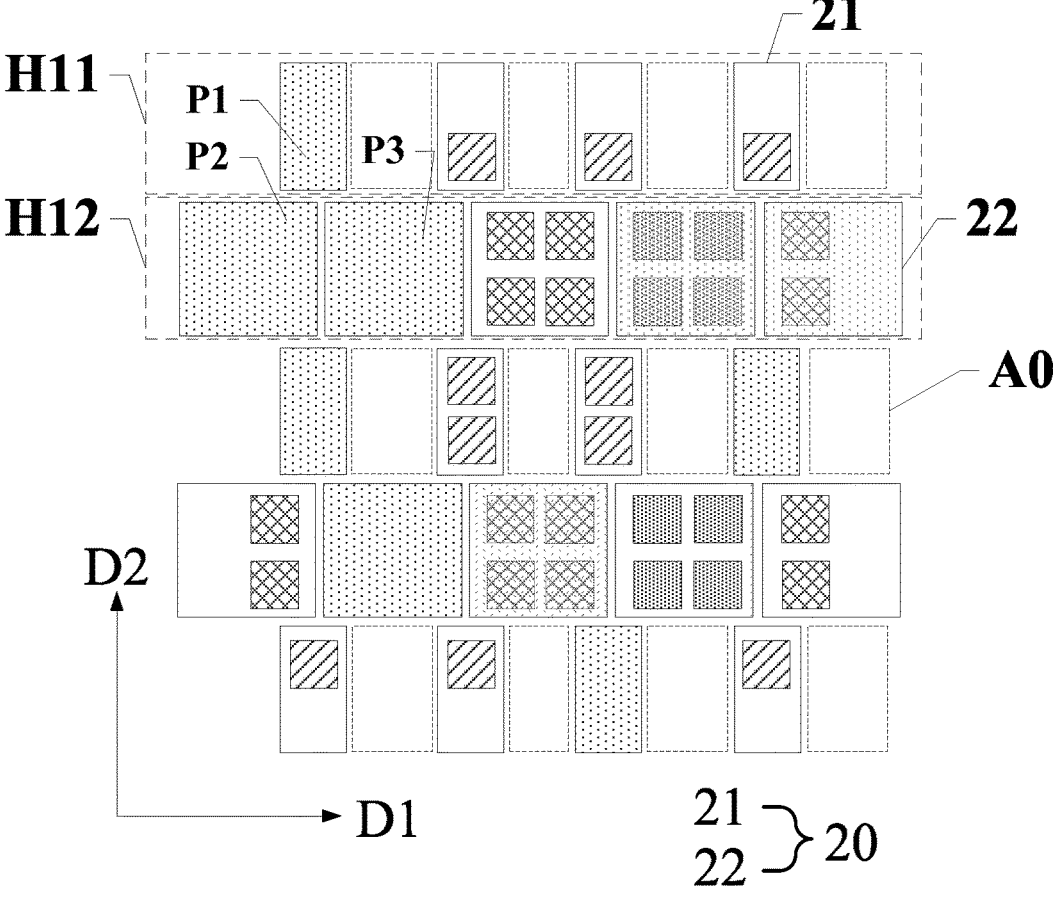
FIG. 12 illustrates a relative position diagram of cathode electrode blocks and light-emitting layers in a display panel according to one embodiment of the present disclosure.
Figure 13:
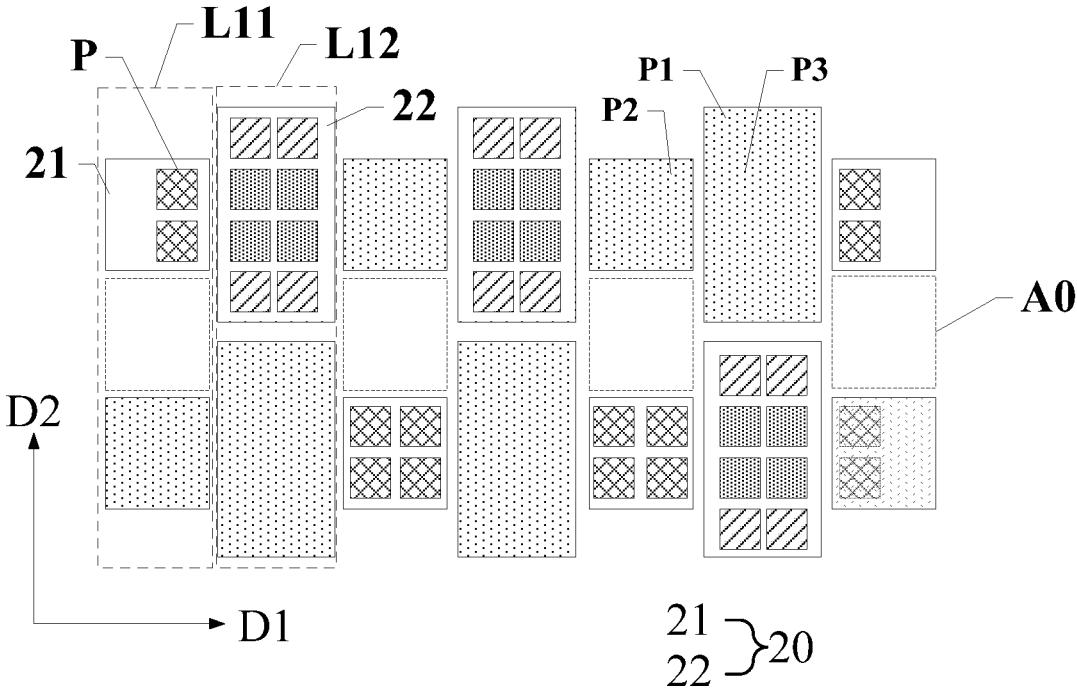
FIG. 13 illustrates another relative position diagram of cathode electrode blocks and light-emitting layers in a display panel according to one embodiment of the present disclosure.

FIG. 11 illustrates a film layer diagram of a display panel according to one embodiment of the present disclosure. FIGS. 12 and 13 respectively illustrate relative position diagrams of the cathode electrode block 20 and light-emitting layers 30 in a display panel provided by embodiments of the present disclosure. Referring to FIGS. 11-13, in one optional embodiment, a subpixel P includes a light-emitting layer 30 and cathode electrode blocks 20 and an anode electrode blocks 10 on two sides of the light-emitting layer 30 along a direction perpendicular to a plane where the display panel is located. The display panel includes a plurality of cathode electrode blocks 20. In two adjacent pixel units P0, at least two adjacent subpixels P with a same color share a same cathode electrode block 20.

Specifically, in one embodiment, the subpixel being a diode with an organic electroluminescence structure P is taken as an example for illustration. When the cathode electrode block 20 and the anode electrode block 10 are respectively supplied with different voltages, light-emitting materials of the light-emitting layers 30 can be excited to emit light. Optionally, colors of part of the light-emitting materials of the light-emitting layers 30 are red, colors of part of the light-emitting materials of the light-emitting layers 30 are green, and colors of part of the light-emitting materials of the light-emitting layers 30 are blue. When at least two adjacent subpixels P with a same color share one cathode electrode block 20 in two adjacent pixel units in the embodiment, compared with a method of disposing different cathode electrode blocks 20 for different subpixels P, a size of a single cathode electrode block 20 is increased, thereby helping reduce a complexity of a forming process, helping increase opening sizes of a metal mask required in the forming process at a same time, helping reduce number of openings of the metal mask used in the forming process, avoiding reduce a strength of the metal mask due to too many openings and too small size of the metal mask and improving strength of the metal mask.

Referring to FIG. 12, in one optional embodiment, colors of subpixels P corresponding to a same cathode electrode block 20 are all same.

With reference to FIG. 11 and FIG. 12, when a pixel arrangement shown in FIG. 12 is adopted, part of the cathode electrode blocks 20 correspond to four subpixels P of a same color sharing a same second cathode electrode block 21. A first cathode electrode block 21 corresponds to two subpixels with a same color sharing a same first cathode electrode block 21. A way that adjacent subpixels P of a same color share a same cathode electrode block 20 is conducive to simplifying a forming process of cathode electrode blocks 20 and improving production efficiency.

Referring to FIG. 12 and FIG. 13, in one optional embodiment, a cathode electrode block 20 includes a first cathode electrode block 21 and a second cathode electrode block 22, and number N1 of subpixels P corresponding to one first cathode electrode block 21 is less than or equal to number N2 of subpixels P corresponding to one second cathode electrode block 22.

FIG. 12 and FIG. 13 respectively illustrate schemes including two kinds of cathode electrodes in a pixel arrangement structure. When cathode electrode blocks 20 are controlled into two types, it is conducive to simplifying a complexity of an opening pattern of a metal mask, thereby simplifying a forming process of the display panel. In addition, numbers of subpixels P corresponding to the two cathode electrode blocks 20 are different. One of the cathode electrode blocks 20 has a larger size and corresponds to a larger number of subpixels P, and the other cathode electrode block 20 has a smaller size, and corresponds to a smaller number of subpixels P. Optionally, number of subpixels P corresponding to each cathode electrode block 20 is larger than or equal to 2, which is equivalent to increasing a size of a single cathode electrode block 20 in the display panel, and is not only conducive to simplifying a forming process of the cathode electrode block 20, but also conducive to improving strength of a metal mask.

In one optional embodiment, N2=2*N1. Optionally, in one embodiment shown in FIG. 12, number of subpixels P corresponding to the first cathode electrode block 21 is 2, and number of subpixels P corresponding to the second cathode electrode block 22 is 4. In one embodiment shown in FIG. 13, number of subpixels P corresponding to the first cathode electrode block 21 is 4, and number of subpixels P corresponding to the second cathode electrode block 22 is 8. Number of subpixels P corresponding to the cathode electrode block 20 in the embodiments shown in FIG. 12 and FIG. 13 is only illustrative. In some other embodiments, numbers of subpixels P corresponding to the first cathode electrode block 21 and the second cathode electrode block 22 may also be others, which are not specifically limited herein. In the embodiment, number of subpixels P corresponding to the second cathode electrode block is twice number of subpixels P corresponding to the first cathode electrode block, so that the display panel only corresponds to cathode electrode blocks 20 of two sizes, which is conducive to simplifying a structure of a metal mask required in a forming process. Optionally, numbers of subpixels P corresponding to one first cathode electrode block 21 and one second cathode electrode block 22 are even numbers, so that sizes of the first cathode electrode block 21 and the second cathode electrode block are closer to a relatively large size of a square, which can not only simplify a forming difficulty of an evaporation process, improve forming accuracy of the cathode electrode block 20, but also help simplify a production complexity of a metal mask.

Referring to FIGS. 12 and 13, in one optional embodiment, length-to-width ratios of the first cathode electrode block 21 and the second cathode electrode block 22 are different.

It should be noted that the length-to-width ratio mentioned in the embodiment refers to a ratio between a longer side and a shorter side in a shape of an orthographic projection of the cathode electrode block 20 on a light-emitting surface of the display panel. If a dimension of each side is equal, a length-to-width ratio is 1. Taking one embodiment shown in FIG. 13 as an example, number of subpixels P corresponding to one first cathode electrode block 21 is 4, and the four subpixels P are disposed in a 2×2 matrix. Optionally, a shape of the first cathode electrode block 21 is square, and a length-to-width ratio thereof is 1. Number of subpixels P corresponding to one second cathode electrode block 22 is 8, and the eight subpixels P are disposed in a 2×4 matrix. Optionally, a shape of the second cathode electrode block 22 is a rectangle, and a length-to-width ratio thereof is greater than 1. When connection lines between geometric centers of three subpixels P in a single pixel unit P0 are in a triangle shape, the first cathode electrode blocks 21 and the second cathode electrode blocks 22 adopt two size structures with different length-to-width ratios, which can not only meet sharing requirements of adjacent subpixels P in adjacent pixels P0 for the cathode electrode blocks 20, but also avoid unnecessary increases in sizes of the first cathode electrode blocks 21 and the second cathode electrode blocks 22, thereby helping to reduce coupling capacitances between the cathode electrode blocks 20 and other film layers.

In one optional embodiment, length-to-width ratios of the first cathode electrode block 21 and the second cathode electrode block 22 are 0.5-1.5. It can be understood that when an area is same, the smaller a length-to-width ratio of a cathode electrode block 20 is, e.g., less than 0.5, the more difficult the cathode electrode block 20 is to control an opening accuracy of a metal mask, and the more difficult a process will be increased. On the contrary, when the length-to-width ratio of the cathode electrode block 20 is within 1.5, a shape of the cathode electrode block 20 is closer to a square. In addition, a scheme in which a plurality of subpixels P share the cathode electrode block 20 makes a size of the cathode electrode block 20 larger, thereby making openings of the metal mask larger, and helping reduce a difficulty of a forming process.

Referring to FIG. 12, in one optional embodiment, the first cathode electrode blocks 21 form a plurality of first electrode rows H11 disposed along the second direction D2, and the second cathode electrode blocks 22 form a plurality of second electrode rows H12 disposed along the second direction D2. Along the second direction D2, the first electrode rows H11 and the second electrode rows H12 are alternately disposed.

Specifically, the embodiment shown in FIG. 12 illustrates an arrangement structure of the first cathode electrode blocks 21 and the second cathode electrode blocks 22. The cathode electrode blocks 20 included in a same first electrode row H11 are all first cathode electrode blocks 21, and the cathode electrode blocks 20 included in a same second electrode row H12 are all second cathode electrode blocks 22. The first cathode electrode blocks 21 and the second cathode electrode blocks 22 are disposed in rows, which helps simplify the arrangement structure of the first cathode electrode blocks 21 and the second cathode electrode blocks 22 on the display panel, simplify a forming difficulty of a metal mask required in a forming process, and helps simplify an overall forming complexity of the display panel.

Referring to FIG. 12, in one optional embodiment, a same first cathode electrode block 21 corresponds to at least two subpixels P, a same second cathode electrode block 22 corresponds to at least two subpixels P, and at least two different second cathode electrode blocks 22 respectively correspond to subpixels P with different light-emitting colors.

Specifically, when the plurality of first electrode rows H11 and the second electrode rows H12 are alternately disposed along the second direction D2, the present embodiment further confines that number of subpixels P corresponding to each of the first cathode electrode blocks 21 and number of subpixels P corresponding to each of the second cathode electrode blocks 22 are greater than or equal to 2, which helps increase a size of a single corresponding cathode electrode block 20 and reduce a difficulty of forming the cathode electrode blocks 20 and a corresponding metal mask. In addition, for the first cathode electrode blocks 21, colors of subpixels P corresponding to each of the first cathode electrode blocks 21 are same, e.g., the subpixels P are all first color subpixels P1. For the second cathode electrode blocks 22, subpixels P corresponding to part of the second cathode electrode blocks 22 are second color subpixels P2, and the subpixels P corresponding to another part of the second cathode electrode blocks 22 are third-color subpixels P3. Optionally, along the first direction D1, the second cathode electrode blocks 22 corresponding to the second color subpixels P2 and the second cathode electrode blocks 22 corresponding to the third color subpixels P3 are alternately disposed. In the above arrangement structure, colors of subpixels P corresponding to a single cathode electrode block 20 are all same, which helps simplify a corresponding relationship between the cathode electrode block 20 and the subpixels P and simplify an arrangement structure of the first cathode electrode blocks 21 and the second cathode electrode blocks 22 at a same time.

Referring to FIG. 12, in one optional embodiment, subpixels P corresponding to the first cathode electrode blocks 21 are first-color subpixels P1, and subpixels P corresponding to part of the second cathode electrode blocks 22 are second color subpixels P1, and subpixels P corresponding to another part of the second cathode electrode block 22 are third color subpixels P3.

Optionally, the first color subpixel P1 is a green subpixel, the second color subpixel P2 and the third color subpixel P3 are a red subpixel and a blue subpixel respectively. In some other embodiments, the first color subpixel P1 may also be a red subpixel, and the second color subpixel P2 and the third color subpixel P3 are a green subpixel and a blue subpixel respectively. Alternatively, the first color subpixel P1 is a blue subpixel, and the second color subpixel P2 and the third color subpixel P3 are a red subpixel and a green subpixel respectively. Taking an arrangement shown in FIG. 12 as an example, in adjacent first electrode row H11 and second electrode row H12, in four adjacent pixel units P0 disposed along the first direction D1 and the second direction D2 respectively, four third color subpixels P3 are adjacent, and four third-color subpixels P3 share a same second cathode electrode block 22; or four second color subpixels P2 are adjacent, and four second color subpixels P2 share a same second cathode electrode block 22. The greater number of subpixels P corresponding to a same cathode electrode block 20, the more conducive to reducing a difficulty of forming the openings of the metal mask, and the more conducive to reducing a difficulty of forming the cathode electrode blocks 20.

Referring to FIG. 13, in one optional embodiment, the first cathode electrode blocks 21 forms a plurality of first electrode columns L11 disposed along the first direction D1, and the second cathode electrode blocks 22 form a plurality of second electrode columns L12 disposed along the first direction D1. Along the first direction D1, the first electrode columns L11 and the second electrode columns L12 are alternately disposed.

Specifically, the embodiment shown in FIG. 13 illustrates an arrangement structure of the first cathode electrode blocks 21 and the second cathode electrode blocks 22. The cathode electrode blocks 20 included in a same first electrode row L11 are all first cathode electrode blocks 21, and the cathode electrode blocks 20 included in a same second electrode row L12 are all second cathode electrode blocks 22. The first cathode electrode blocks 21 and the second cathode electrode blocks 22 are disposed alternately in columns, which helps simplify the arrangement structure of the first cathode electrode blocks 21 and the second cathode electrode blocks 22 on the display panel, simplify a forming difficulty of a metal mask required in a forming process and simplify an overall forming complexity of the display panel.

Referring to FIG. 13, in one optional embodiment, a same first cathode electrode block 21 corresponds to at least two subpixels P, and light-emitting colors of the subpixels P corresponding to a same first cathode electrode block 21 are same. A same second cathode electrode block 22 corresponds to a plurality of subpixels P, and subpixels P corresponding to a same second cathode electrode block 22 are two types of subpixels P with different light-emitting colors.

Specifically, when the first electrode row L11 and the second electrode row L12 are alternately disposed along the first direction D1, the embodiment further confines that number of subpixels P corresponding to each of the first cathode electrode blocks 21 and number of subpixels P corresponding to each of the second cathode electrode blocks 22 are greater than or equal to 2, which helps increase a size of a single corresponding cathode electrode block 20, further helps reduce a difficulty of forming the cathode electrode blocks. 20 and a corresponding metal mask and improves production efficiency of the display panel. In addition, in the embodiment, colors of subpixels P corresponding to a same first cathode electrode block 21 are same, and colors of subpixels P corresponding to the first cathode electrode blocks 21 are all same. Subpixels P corresponding to a same second cathode electrode block 22 are two types of subpixels P with different light-emitting colors, which is equivalent to sharing a same second cathode electrode 22 with two adjacent subpixels P in a same pixel unit P0 along the second direction D2. In four adjacent pixel units P0 disposed along the first direction D1 and the second direction D2, eight subpixels P are adjacent and share a same second cathode electrode block 22, thereby increasing an area of a same second cathode electrode block 22. Moreover, subpixels P corresponding to the second cathode electrode blocks 22 are disposed in a 2×4 matrix, which increases a width of the second cathode electrode blocks 22 along the first direction D1 compared to a single-column arrangement, which helps reduce a difficulty of forming the openings of the metal mask required in a forming process, helps reduce a forming difficulty of the second cathode electrode block 22, and helps improve overall production efficiency of the display panel.

In addition, in the embodiment shown in FIG. 13, the first electrode row L11 and the second electrode row L12 are alternately disposed along the first direction D1, and the adjacent first cathode electrode blocks 21 and the second cathode electrode blocks 22 are also alternately disposed along the first direction D1. The above arrangement simplifies an overall arrangement structure of the first cathode electrode block 21 and the second cathode electrode block 22 on the display panel, and also helps simplify an opening complexity of the metal mask required in a forming process.

Referring to FIG. 13, in one optional embodiment, subpixels P corresponding to the first cathode electrode block 21 are second color subpixels P2, and subpixels P corresponding to the second cathode electrode block 22 are first color subpixels P1 and third color subpixels P3.

Optionally, the second color subpixel is a red subpixel P, the first color subpixel P1 and the third color subpixel P3 are a green subpixel and a blue subpixel respectively, which are equivalent to that, in a same pixel unit row H, green subpixels Pixels are in a row, and the red subpixels and the blue subpixels are in another row. In some other embodiments, a color distribution of the first color subpixel P1, the second color subpixel P2, and the third color subpixel P3 may also be embodied as others. For example, the second color subpixel P2 is a green subpixel, the first color subpixel P1 and the third color subpixel P3 are a blue subpixel and a red subpixel respectively, the blue subpixels are in a row, and the red and green subpixels are in another row. Alternatively, the second color subpixel P2 is a blue subpixel, the first color subpixel P1 and the third color subpixel P3 are a red subpixel and a blue subpixel respectively, the red subpixels are in a row, and the green and blue subpixels are in another row.

Figure 14:
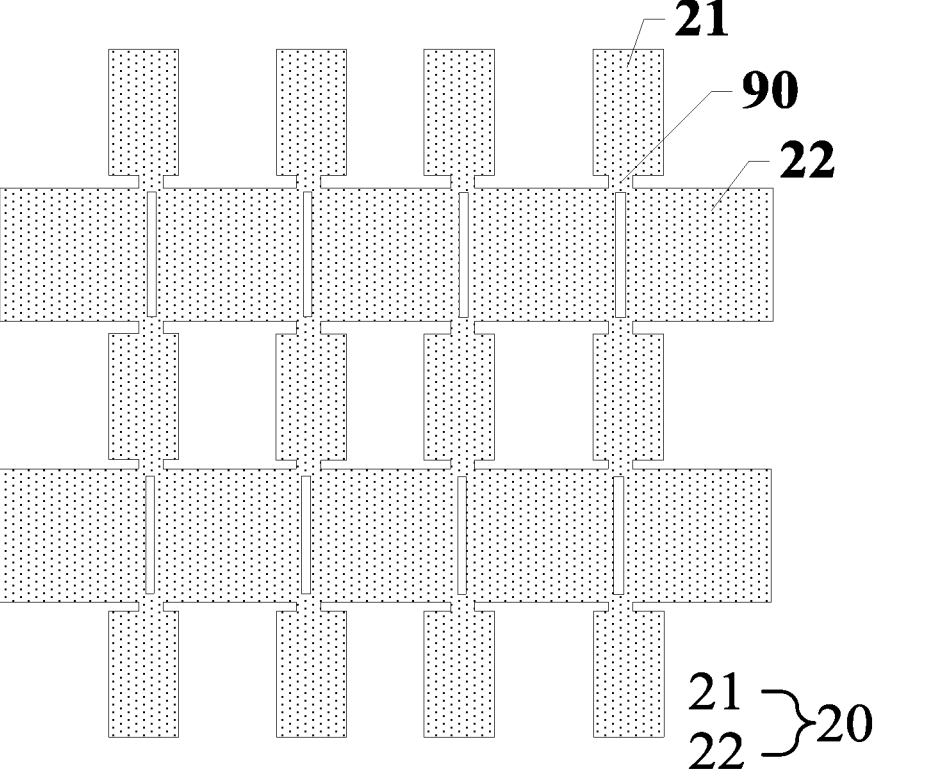
FIG. 14 illustrates a connection diagram of first cathode electrode blocks and second cathode electrode blocks in a display panel according to one embodiment of the present disclosure.
Figure 15:
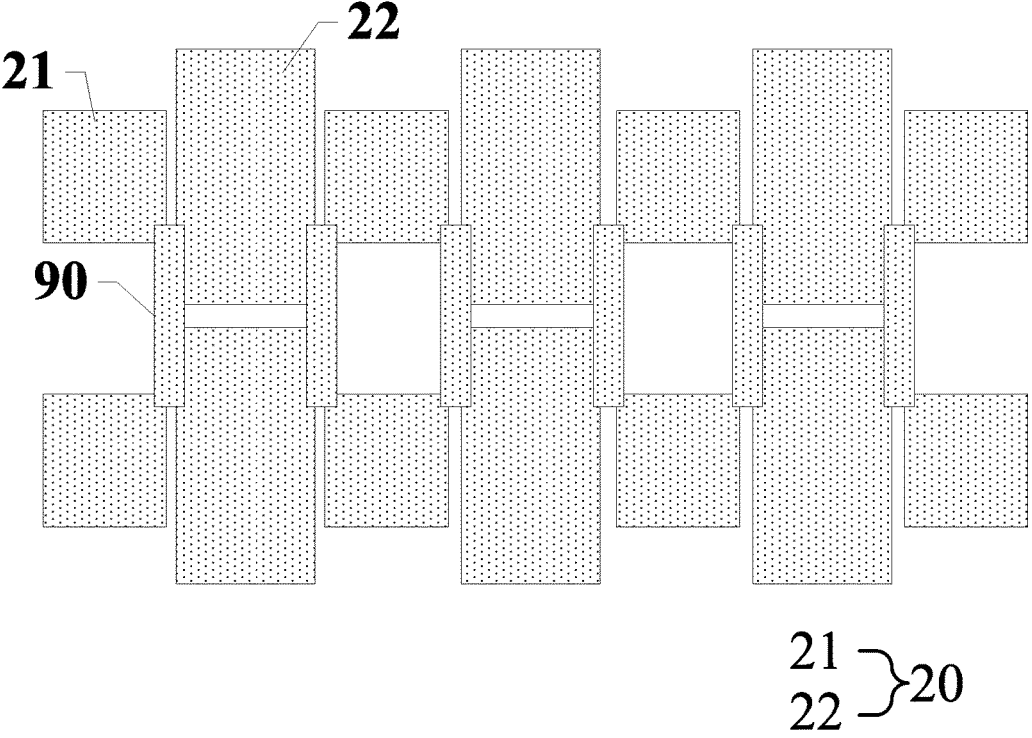
FIG. 15 illustrates another connection diagram of first cathode electrode blocks and second cathode electrode blocks in a display panel according to one embodiment of the present disclosure.

FIG. 14 and FIG. 15 are connection diagrams of the first cathode electrode blocks 21 and the second cathode electrode blocks 22 respectively. In one optional embodiment, two adjacent cathode electrode blocks 20 are electrically connected through first connection portions 90. The first connection portions 90 and the cathode electrode block 20 are disposed on a same layer.

Optionally, in an organic light-emitting diode display panel, the cathode electrode block 20 corresponding to each subpixel P is equipotential, i.e., receives a same fixed voltage signal. One implementation in a related art is to use cathode electrodes as a whole surface structure, which increases coupling capacitances between the cathode electrodes and other film layers and affects an accuracy and a reliability of a display. In one embodiment, a plurality of cathode electrode blocks 20 are introduced for subpixels P, e.g., a plurality of first cathode electrode blocks 21 and a plurality of second cathode electrode blocks 22 are introduced, thereby reducing a total area occupied by the cathode electrode blocks 20 on a light-emitting surface of the display panel, thereby helping reduce coupling capacitances between the cathode electrode blocks 20 and other film layers and improve display accuracy and display reliability. At a same time, a method of reducing a total area of the cathode electrode blocks 20 helps improve overall light transmittance of the display panel. In the embodiment, two adjacent cathode electrode blocks 20 are electrically connected through the first connection portions 90, so that each of the first cathode electrode blocks 21 and each of the second cathode electrode blocks 22 are electrically connected to each other and can also receive a same fixed voltage signal. Optionally, the first connection portions 90, the first cathode electrode blocks 21 and the second cathode electrode blocks 22 are disposed on a same layer. The first connecting portion 90, the first cathode electrode block 21 and the second cathode electrode block 22 can be evaporated in a same process using a same metal mask without an additional separate mask for the first connecting portion 90, thereby simplifying a production process and helping improve production efficiency.

When the cathode electrode blocks 20 adopt an arrangement structure shown in FIG. 14, one first cathode electrode block 21 and two second cathode electrode blocks 22 on a side of the one first cathode electrode block 21 along the second direction D2 can be electrically connected through the first connection portions 90, thereby helping reduce number of the first connection portions 90 included on the display panel and helping simplify a forming process of a metal mask required in a forming process. When the cathode electrode block 20 adopts an arrangement structure shown in FIG. 15, the first cathode electrode blocks 21 and the second cathode electrode blocks 22 in adjacent first electrode row and second electrode row can be electrically connected by a same first connection portion 90, thereby helping reduce number of the first connecting portions 90 included on the display panel, and simplifying a forming process of a metal mask required in a forming process.

Figure 16:
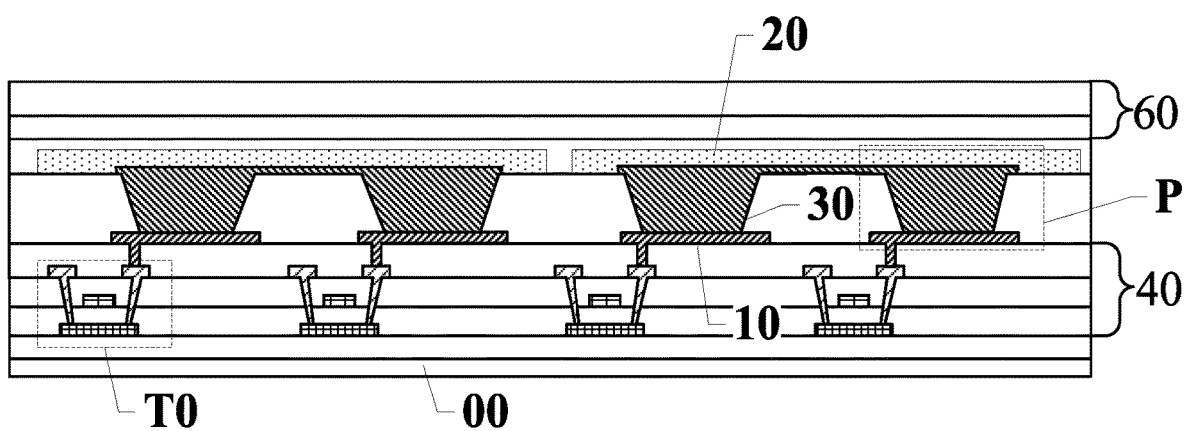
FIG. 16 illustrates another film layer diagram of a display panel according to one embodiment of the present disclosure.

FIG. 16 illustrates another film layer diagram of a display panel according to one embodiment of the present disclosure. In one optional embodiment, the light-emitting layers 30 of at least two subpixels P of a same color corresponding to a same cathode electrode block 20 are connected.

Optionally, the display panel provided by the embodiment of the present disclosure includes a substrate 00, an array layer 40 disposed on the substrate 00, subpixels P disposed on a side of the array layer away from the substrate 00, and an encapsulation layer 60 disposed on a side of the subpixels P away from the substrate 00. Optionally, a subpixel P includes an anode electrode block 10, a light-emitting layer 30 and a cathode electrode block 20. Referring to FIG. 12 or FIG. 13, in two adjacent pixels P0, two adjacent subpixels P share a same cathode electrode block 20. When light-emitting colors of two adjacent subpixels P are same, light-emitting layers 30 of the two subpixels P are connected, i.e., the light-emitting layers 30 of two adjacent subpixels P can share openings of a same mask for evaporation, thereby helping increase sizes of the openings on the mask required for evaporating the light-emitting layers 30, helping reduce number of openings of a metal mask used in a process of evaporating the light-emitting layers 30, avoiding a strength reduction of the metal mask due to too many openings and the too small size of the metal mask, and improving strength of the metal mask. It should be noted that, since connection portions of the light emitting layers 30 of two adjacent subpixels P are not in contact with anodes of the corresponding subpixels P, the connection portions do not emit light and not affect normal light emissions of the two subpixels P.

Referring to FIG. 16, in one optional embodiment, the anode electrode blocks 10 of different subpixels P of a same color corresponding to a same cathode electrode block 20 are insulated from each other, and the anode electrode blocks 10 of different subpixels P are respectively connected to different driving circuits.

FIG. 16 only illustrates transistors T0 connected to the anode electrode blocks 10, and the transistors T0 can be, e.g., driving transistors in a driving circuit. It can be understood that the driving circuit may further include a plurality of other transistors. For example, the driving circuit may be embodied as a 7T1C driving circuit or an 8T1C driving circuit in a related art, or any other feasible driving circuit, which is not specifically limited herein.

Specifically, referring to FIG. 12, FIG. 13, and FIG. 16, when two adjacent subpixels P of a same color in two adjacent pixel units P0 share a same cathode electrode block 20, one embodiment further confines that anodes of the two subpixels P are independent and insulated from each other, and anodes of different subpixels P are respectively connected to different driving circuits. That is, each subpixel P is controlled by an independent driving circuit to emit light, thereby helping improve control flexibility of each subpixel P and meeting display needs of the display panel for different images.

Figure 17:
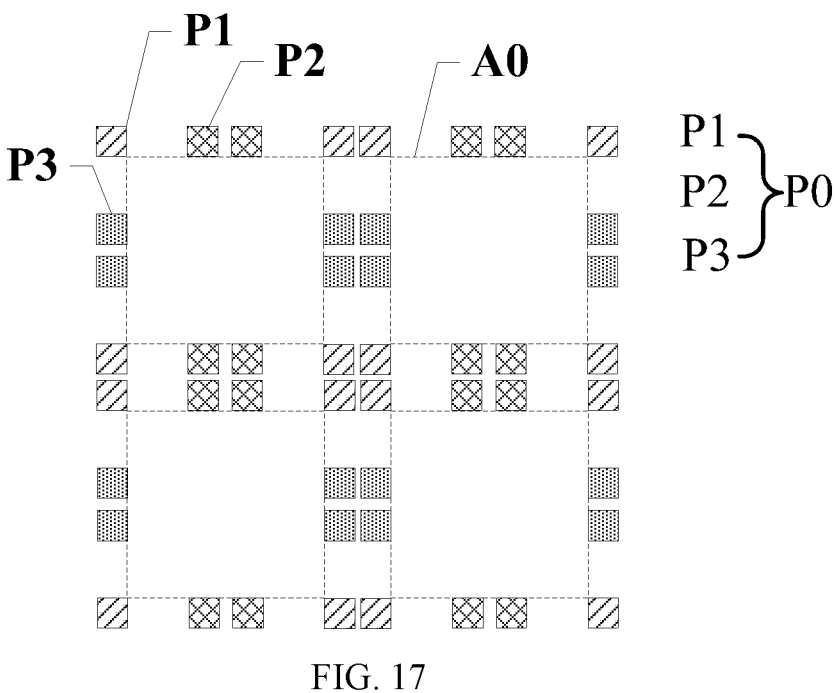
FIG. 17 illustrates another pixel arrangement diagram of a display panel according to one embodiment of the present disclosure.

FIG. 17 illustrates another pixel arrangement diagram of a display panel according to one embodiment of the present disclosure. The embodiment illustrates a relative position diagram of the pixel unit P0 and the light-transmitting area A0 in the display panel.

Referring to FIG. 17, in one optional embodiment, the display panel further includes a plurality of light-transmitting areas A0, and subpixels P in the pixel units P0 at least partially surround the light-transmitting areas A0. In a same pixel unit P0, at least one subpixel P is on a side of the light-transmitting area A0 along the first direction D1, and at least one subpixel P is on a side of the light-transmitting area A0 along the second direction D2.

In the embodiment, the display panel includes a plurality of pixel units P0 and a plurality of light-transmitting areas A0. Optionally, when the display panel is a transparent display panel, an area where the plurality of pixel units P0 are located can be used to dispose a pixel structure to display to-be-displayed images using the pixel units P0. The plurality of light-transmitting areas A0 can transmit light to achieve characteristics of both transparency and display of the display panel.

Specifically, in the embodiment, a positional relationship between the pixel units P0 and the light-transmitting areas A0 is embodied in that the subpixels P in the pixel units P0 are at least partially disposed around the light-transmitting areas A0. Taking the embodiment shown in FIG. 17 as an example, areas framed by a plurality of dotted boxes represent a plurality of light-transmitting areas A0 respectively. Four pixel units P0 are disposed on a periphery of each light-transmitting area A0. In a same pixel unit P0, at least one subpixel P is on a side of a light-transmitting area A0 along the first direction D1, and at least one subpixel P is on a side of the light-transmitting area A0 along the second direction D2. Therefore, subpixels P are disposed on top, bottom, left, right sides of a same light-transmitting area A0, that is, the same light-transmitting area A0 can emit light on the top, bottom, left, and right sides, thereby avoiding a situation where a plurality of light-transmitting areas A0 are combined to form a long strip-like light-transmitting area A0 with a relatively large area, breaking a regular arrangement structure of a long strip-like transparent area, helping weaken or avoid display bright lines that exist on the transparent display panel in a display process, weakening or avoiding an occurrence of a diffraction phenomenon, and helping improve overall display quality of the display panel.

For pixel arrangements shown in FIG. 12 and FIG. 13, subpixels P in a same pixel unit P0 are also disposed around a light-transmitting area A0. In other words, each light-transmitting area A0 is surrounded by at least part of the subpixels P, which can also break a regular arrangement structure of a long strip-like transparent areas, thereby helping weaken or avoid display bright lines that exist on the transparent display panel in a display process, weakening or avoiding an occurrence of a diffraction phenomenon, and helping improve overall display quality of the display panel.

Figure 18:
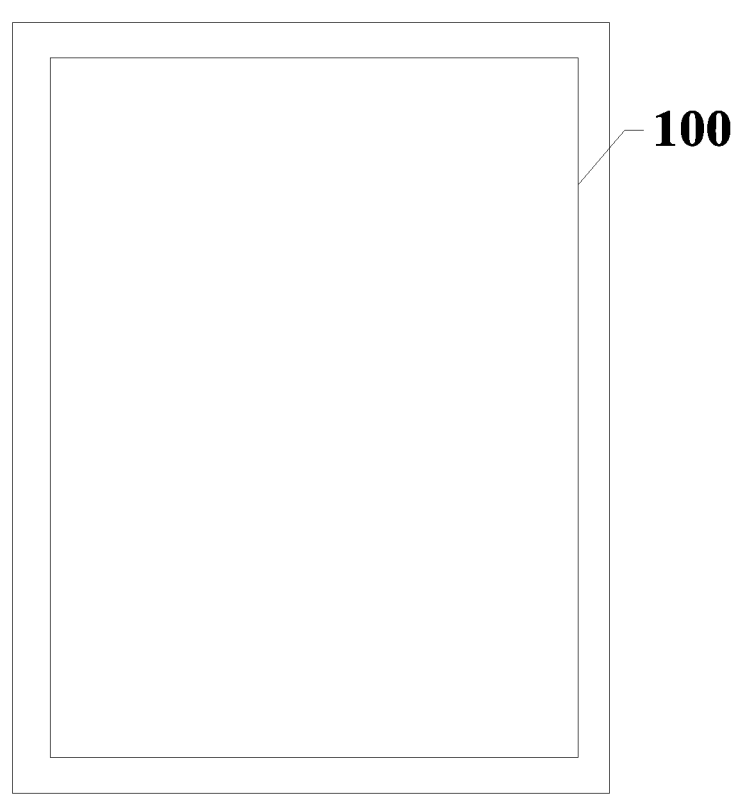
FIG. 18 illustrates a structural view of a display device according to one embodiment of the present disclosure.

FIG. 18 illustrates a structural view of a display device according to one embodiment of the present disclosure. Referring to FIG. 18, based on a same inventive concept, the present disclosure further provides a display device 200 including a display panel 100 in any of the above embodiments.

It can be understood that the display device 200 provided in the embodiment may be a computer, a TV, a vehicle-mounted display device, and another display device with a display function, and is especially suitable for a display device with a transparent display function such as a building window, a car window, and a shop window, which is not specifically limited herein. The display device has beneficial effects of the display panel in any of the above embodiments. For details, reference may be made to specific descriptions of the display panel in the above embodiments, which is repeated herein.

As disclosed, the display panel and the display device provided by the present disclosure achieve at least the following beneficial effects.

In the display panel and the display device provided by the embodiments of the present disclosure, an arrangement of the subpixels included in the pixel units is improved. A same pixel includes at least three subpixels with different colors, at least two subpixels in the same pixel are disposed along the first direction, and along the second direction, another subpixel is on a side of the two subpixels disposed along the first direction. Each pixel has both subpixels disposed in the first direction and subpixels disposed in the second direction. Compared with a related art in which a plurality of subpixels in a same pixel are all disposed along the first direction, or all disposed along the second direction, in the present disclosure, when a plurality of pixels emits light, there are both light emitted by the subpixels disposed along the first direction and light emitted by the subpixels disposed along the second direction, thereby effectively avoiding or weakening a difference between light brightness emitted by two adjacent pixel rows and light brightness of an area between the two adjacent pixel rows, or effectively avoiding a difference between light brightness emitted by two adjacent pixel columns and light brightness of an area between the two adjacent pixel columns, and avoiding or weakening a phenomenon of visual bright lines in a display process. When applied to a transparent display product, the present disclosure helps improve display quality of the transparent display product.

In addition, in the display panel provided by the present disclosure, in two pixel units that are at least partially adjacent, a subpixel in one of the two pixel units is adjacent to a subpixel in the other one of the two pixel units, and the two adjacent subpixels have a same color. The cathode electrode blocks of two adjacent subpixels with a same color can be shared and co-evaporated, thereby helping reduce a complexity of a forming process.

Although some specific embodiments of the present disclosure have been described in detail by way of examples, a person skilled in the art should understand that the above examples are provided for illustration only and are not intended to limit the scope of the present disclosure. A person skilled in the art should understand that modifications may be made to the above embodiments without departing from the scope and spirit of the present disclosure. The scope of the present disclosure is defined by the appended claims.

What is claimed is:

1. A display panel, comprising a plurality of pixel units disposed along a first direction and a second direction, wherein:

a pixel unit of the plurality of pixel units includes at least three subpixels with different colors;

in a same pixel unit, at least two of the subpixels are disposed along a first direction, along a second direction, at least one of the subpixels is on a side of the two subpixels disposed along the first direction, and the first direction intersects the second direction;

in two pixel units that are at least partially adjacent, a subpixel in one of the two pixel units is adjacent to a subpixel in the other one of the two pixel units, and colors of the two adjacent subpixels are same;

each of the at least three subpixels includes a light-emitting layer, and a cathode electrode block and an anode electrode block on two sides of the light-emitting layer along a direction perpendicular to a plane where the display panel is located; and the display panel includes a plurality of cathode electrode blocks that are patterned as discrete cathode islands on a cathode layer, and in two adjacent pixel units, at least two adjacent subpixels with a same color share a same cathode electrode block.

2. The display panel according to claim 1, wherein subpixels in two adjacent pixel units along the first direction are disposed in a mirror image arrangement, and/or, subpixels in two adjacent pixel units along the second direction are disposed in a mirror image arrangement.

3. The display panel according to claim 1, wherein the pixel unit of the plurality of pixel units includes three subpixels with different colors, and lines connecting geometric centers of the three subpixels in a same pixel unit are a right-angled triangle or an isosceles triangle.

4. The display panel according to claim 1, wherein the plurality of pixel units forms a plurality of pixel cell rows disposed along the second direction and a plurality of pixel cell columns disposed along the first direction, subpixels in two adjacent pixel cell rows are disposed in a mirror image arrangement, and subpixels in two adjacent pixel cell columns are disposed in a mirror image arrangement.

5. The display panel according to claim 4, wherein a same pixel unit row includes a first subpixel row and a second subpixel row, the first subpixel row includes first color subpixels, and the second subpixel row includes second color subpixels and third color subpixel subpixels.

6. The display panel according to claim 1, wherein colors of subpixels corresponding to a same cathode electrode block are same.

7. The display panel according to claim 1, wherein the plurality of cathode electrode blocks includes first cathode electrode blocks and second cathode electrode blocks, number N1 of subpixels corresponding to one of the first cathode electrode blocks is less than or equal to number N2 of subpixels corresponding to one of the second cathode electrode blocks.

8. The display panel according to claim 7, wherein N2=2*N1.

9. The display panel according to claim 1, wherein length-to-width ratios of the first cathode electrode block and the second cathode electrode block are different.

10. The display panel according to claim 9, wherein length-to-width ratios of the first cathode electrode block and the second cathode electrode block are 0.5-1.5.

11. The display panel according to claim 7, wherein the first cathode electrode blocks form a plurality of first electrode rows disposed along the second direction, the second cathode electrode blocks form a plurality of second electrode rows disposed along the second direction, and along the second direction, the plurality of first electrode rows and the plurality of second electrode rows are alternately disposed.

12. The display panel according to claim 11, wherein a same first cathode electrode block corresponds to at least two subpixels, a same second cathode electrode block corresponds to at least two subpixels, and at least two different second cathode electrode blocks respectively correspond to subpixels with different light-emitting colors.

13. The display panel according to claim 12, wherein subpixels corresponding to the first cathode electrode blocks are first color subpixels, part of subpixels corresponding to the second cathode electrode blocks are second color subpixels, and another part of subpixels corresponding to the second cathode electrode blocks are third color subpixels.

14. The display panel according to claim 1, wherein the first cathode electrode blocks form a plurality of first electrode columns disposed along the first direction, the second cathode electrode blocks form a plurality of second electrode columns disposed along the first direction, along the first direction, the plurality of first electrode columns and the plurality of second electrode columns are alternately disposed.

15. The display panel according to claim 14, wherein:

a same first cathode electrode block corresponds to at least two of the subpixels, and light-emitting colors of subpixels corresponding to a same first cathode electrode block are same; and a same second cathode electrode block corresponds to a plurality of the subpixels, and subpixels corresponding to a same second cathode electrode block are two types of subpixels with different light-emitting colors.

16. The display panel according to claim 15, wherein subpixels corresponding to the first cathode electrode blocks are second color subpixels, and the subpixels corresponding to the second cathode electrode blocks are first color subpixels and third color subpixels.

17. The display panel according to claim 1, wherein two adjacent cathode electrode blocks are electrically connected through first connection portions disposed on a same layer as the two adjacent cathode electrode blocks.

18. The display panel according to claim 1, wherein light-emitting layers of at least two subpixels with a same color corresponding to a same cathode electrode block are connected.

19. The display panel according to claim 1, wherein anode electrode blocks of different subpixels with a same color corresponding to a same cathode electrode block are insulated from each other and are respectively connected to different driving circuits.

20. The display panel according to claim 1, further comprising a plurality of light-transmitting areas, wherein:

subpixels in the pixel units at least partially surround the plurality of light-transmitting areas; and in a same pixel unit, at least one subpixel is on a side of the plurality of light-transmitting areas along the first direction, and at least one subpixel is on a side of the plurality of light-transmitting areas along the second direction.

21. A display device, comprising a display panel comprising a plurality of pixel units disposed along a first direction and a second direction, wherein:

a pixel unit of the plurality of pixel units includes at least three subpixels with different colors;

in a same pixel unit, at least two of the subpixels are disposed along a first direction, along a second direction, at least one of the subpixels is on a side of the two subpixels disposed along the first direction, and the first direction intersects the second direction;

in two pixel units that are at least partially adjacent, a subpixel in one of the two pixel units is adjacent to a subpixel in the other one of the two pixel units, and colors of the two adjacent subpixels are same;

each of the at least three subpixels includes a light-emitting layer, and a cathode electrode block and an anode electrode block on two sides of the light-emitting layer along a direction perpendicular to a plane where the display panel is located; and the display panel includes a plurality of cathode electrode blocks that are patterned as discrete cathode islands on a cathode layer, and in two adjacent pixel units, at least two adjacent subpixels with a same color share a same cathode electrode block.

* * * * *